United States Patent
Park (10) Patent No.: US 8,853,044 B2
(45) Date of Patent: Oct. 7, 2014

(54) PHASE-CHANGE RANDOM ACCESS MEMORY DEVICE AND METHOD OF MANUFACTURING THE SAME

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/076,770

(22) Filed: Nov. 11, 2013

(65) Prior Publication Data

US 2014/0113427 A1    Apr. 24, 2014

Related U.S. Application Data

(62) Division of application No. 13/489,816, filed on Jun. 6, 2012, now Pat. No. 8,592,790.

(30) Foreign Application Priority Data

Nov. 29, 2011   (KR) ........................ 10-2011-0126144

(51) Int. Cl.
*H01L 21/20*  (2006.01)
*H01L 45/00*  (2006.01)
*H01L 27/24*  (2006.01)

(52) U.S. Cl.
CPC ........ *H01L 45/1675* (2013.01); *H01L 45/1293* (2013.01); *H01L 45/06* (2013.01); *H01L 45/126* (2013.01); *H01L 27/2409* (2013.01); *H01L 45/1233* (2013.01)
USPC ........... 438/381; 438/384; 438/739; 438/238; 257/1; 257/2; 257/5; 257/E29.118

(58) Field of Classification Search
CPC . H01L 45/06; H01L 45/1233; H01L 27/2409; H01L 45/126
USPC .................. 257/1–5, 148, 328–329, E29.118, 257/E45.002; 438/381, 384, 739, 238
See application file for complete search history.

(56) References Cited

U.S. PATENT DOCUMENTS

2010/0264395 A1* 10/2010 Liu ................................. 257/2

* cited by examiner

*Primary Examiner* — Mark A Laurenzi
(74) *Attorney, Agent, or Firm* — IP & T Group LLP (57) ABSTRACT

A phase-change random access memory (PCRAM) device includes a semiconductor substrate; switching elements formed on the semiconductor substrate; a plurality of phase-change structures formed on the switching elements; and heat absorption layers buried between the plurality of phase-change structures, wherein the plurality of phase-change structures are insulated from the heat absorption layers.

11 Claims, 14 Drawing Sheets

PHASE-CHANGE RANDOM ACCESS MEMORY DEVICE AND METHOD OF MANUFACTURING THE SAME

CROSS-REFERENCES TO RELATED APPLICATION

This application is a division of U.S. patent application Ser. No. 13/489,816 filed on Jun. 6, 2012, which claims priority under 35 U.S.C. 119(a) to Korean application number 10-2011-0126144, filed on Nov. 29, 2011. The disclosure of each of the foregoing application is incorporated by reference in its entirety as if set forth in full.

BACKGROUND

1. Technical Field

The relates to a phase-change random access memory (PCRAM) device, and more particularly, to a PCRAM device and a method of manufacturing the same.

2. Related Art

With demands on lower power consumption, next-generation memory devices having nonvolatile and non-refresh properties have been studied. A PCRAM device of the next-generation memory devices includes a switching element connected at intersections of word lines and bit lines, which are arranged to cross each other, a lower electrode electrically connected to the switching element, a phase-change layer formed on the lower electrode, and an upper electrode formed on the phase-change layer.

In a conventional PCRAM device, when a write current flows through the switching element and the lower electrode, Joule heat is generated at an interface between the phase-change layer and the lower electrode. The phase-change layer is phase-changed into an amorphous state or a crystalline state by the generated joule heat. Therefore, the conventional PCRAM device stores data using a difference between resistances in the amorphous state and the crystalline state of the phase-change layer.

However, in the conventional PCRAM device, the Joule heat generated when the write current flows affects a phase-change layer of adjacent cell.

The effect on adjacent cells is generally referred to as thermal disturbance. In recent years, the thermal disturbance has an increased effect on adjacent cells when a semiconductor memory device is highly integrated.

Figure 1A:
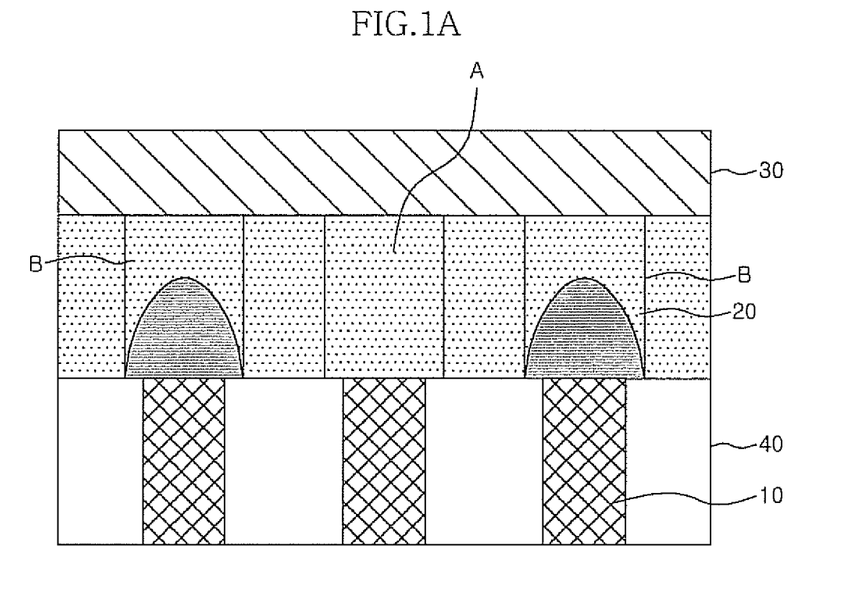
FIGS. 1A and 1B are views illustrating a thermal disturbance phenomenon in a general PCRAM device.
Figure 1B:
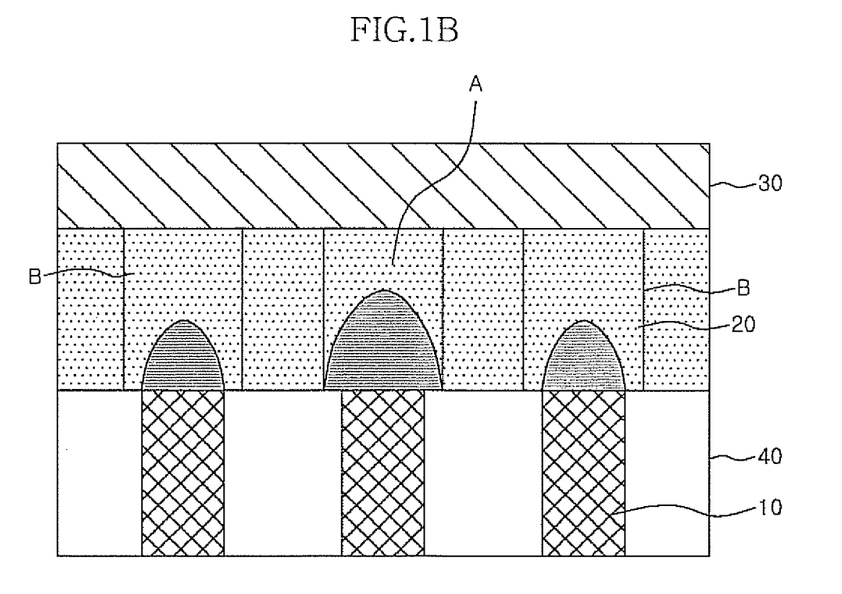

FIGS. 1A and 1B are views illustrating thermal disturbance of a conventional PCRAM device.

As shown in FIGS. 1A and 1B, the conventional PCRAM device includes a lower electrode 10 formed on a switching element (not shown), a phase-change layer 20 formed on the lower electrode 10, and an upper electrode 30 formed on the phase-change layer 20. The reference numeral 40 denotes an insulating layer.

As shown in FIG. 1A, if a cell A is written when cells B are written with data "1", which is a high resistance state, Joule heat is generated at an interface between the lower electrode 10 and the phase-change layer 20 of the cell A (see FIG. 1B), and thus, phase-change material patterns of amorphous states in the cells B are crystallized. Therefore, resistances of the cells B are reduced.

The thermal disturbance generated in the conventional PCRAM device may cause a malfunction, and thus reliability of the conventional PCRAM device is degraded.

SUMMARY

One or more exemplary embodiments are provided to a method of a PCRAM device and a method of manufacturing the same that are capable of improving reliability of the PCRAM device by preventing thermal disturbance from being generated.

According to one aspect of an exemplary embodiment, there is a provided a PCRAM device. The PCRAM device may include: a semiconductor substrate; switching elements formed on the semiconductor substrate; a plurality of phase-change structures formed on the switching elements; and heat absorption layers buried between the plurality of phase-change structures, wherein the plurality of phase-change structures are insulated from the heat absorption layers.

According to another aspect of an exemplary embodiment, there is a provided a method of manufacturing a PCRAM device. The method may include: providing a semiconductor substrate; forming switching elements on the semiconductor substrate; forming a plurality of phase-change structures on the switching elements; and forming heat absorption layers between the plurality of phase-change structures.

According to another aspect of an exemplary embodiment, there is a provided a PCRAM device. The PCRAM device may include: a semiconductor substrate; a plurality of switching elements formed on the semiconductor substrate; first heat absorption layers buried between the plurality of switching elements, wherein the plurality of switching elements are insulated from the first heat absorption layers; a plurality of phase-change structures formed on the plurality of switching elements; and second heat absorption layers formed on the first heat absorption layers buried between the plurality of phase-change structures, wherein the plurality of phase-change structures are insulated from the second heat absorption layers.

According to another aspect of an exemplary embodiment, there is a provided a method of manufacturing a PCRAM device. The method may include: providing a semiconductor substrate; forming a switching element and a lower electrode on the semiconductor substrate; forming a first insulating layer on sidewalls of the switching element and the lower electrode; forming a first heat absorption layer between the first insulating layer to a height corresponding to the switching element; forming a phase-change layer and an upper electrode on the switching element; forming a second insulating layer on sidewalls of the phase-change layer and the upper electrode; and forming a second heat absorption layer connected to the first heat absorption layer to a height corresponding to the lower electrode and the phase-change layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
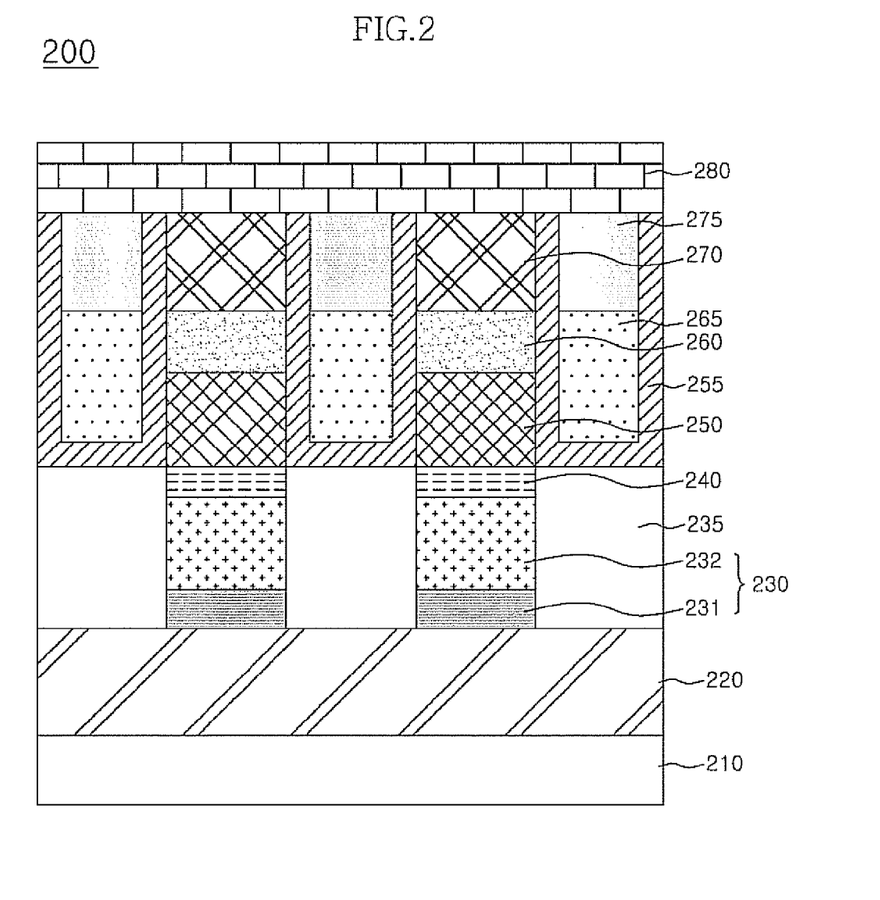
FIG. 2 is a view illustrating a configuration of a PCRAM device according to a first exemplary embodiment of the present invention.

FIG. 2 is a view illustrating a configuration of a PCRAM device according to a first exemplary embodiment.

Referring to FIG. 2, in a PCRAM device 200 according to a first exemplary embodiment, a word line region 220 is formed on a semiconductor substrate 210. The word line region 220 includes a metal layer or a metal nitride layer.

A first insulating layer 235 is formed on the word line region 220, and a shottky diode 230, which serves as a switching element, is formed within each hole. The first insulating layer may include holes for exposing portions of the word line region 220 corresponding to each cell (not shown). The shottky diode 230 includes a barrier metal layer 231, which is in contact with the word line region 220, and a P+ polysilicon layer 232, which is formed on the barrier metal layer 231. In the first exemplary embodiment, the switching element is formed as a shottky diode, but the switching element is not limited thereto. A PN diode or a MOS transistor may be used as the switching element.

An ohmic contact layer 240 is formed on the shottky diode 230. The ohmic contact layer 240 includes a medal silicide. Here, the ohmic contact layer 240 is formed to reinforce contact between the shottky diode 230 and a lower electrode 250 and may be omitted, as necessary.

A plurality of phase-change structures are formed on the ohmic contact layers. Each of the plurality of phase-change material structures includes the lower electrode 250, a phase-change layer 260, and an upper electrode 270. In the phase-change memory device 200 according to the first exemplary embodiment, a heat absorption layer 265 is formed to be adjacent to the lower electrode 250 and the phase-change layer 260. The heat absorption layer 265 absorbs Joule heat generated at an interface between the lower electrode 250 and the phase-change layer 260. More specifically, in the PCRAM device 200 according to the first exemplary embodiment, the heat absorption layer 265 is formed in a position corresponding to a second insulating layer 255, the lower electrode 250, and the phase-change layer 260. A third insulating layer 275 is formed above the heat absorption layer 265

A bit line region 280 is formed on the upper electrode 270.

A method of manufacturing the PCRAM according to the first exemplary embodiment will be described in detail with reference to FIGS. 3A to 3E.

FIGS. 3A to 3E are views sequentially illustrating a method of manufacturing the PCRAM according to the first exemplary embodiment.

Figure 3A:
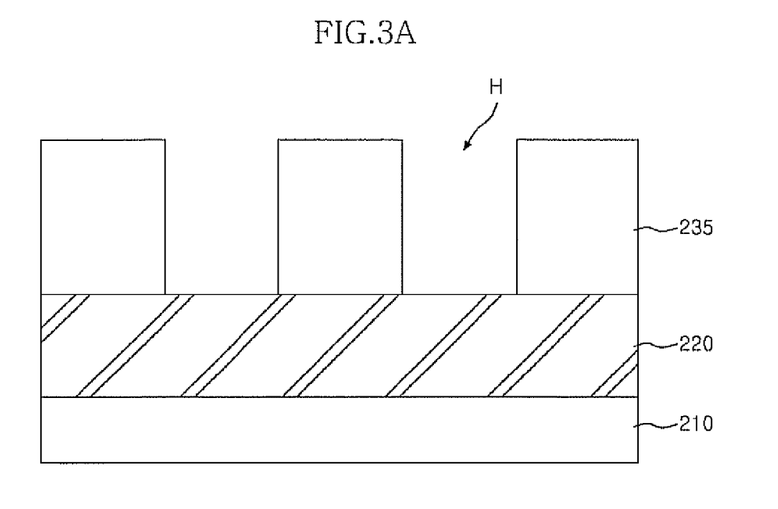
FIGS. 3A to 3E are views sequentially illustrating a method of manufacturing a PCRAM device according to the first exemplary embodiment of the present invention.

First, as shown in FIG. 3A, the method of manufacturing the PCRAM device 200 according to the first exemplary embodiment includes providing a semiconductor substrate 210. A word line region 220 that includes a metal layer or a metal nitride layer is formed on the semiconductor substrate 210.

A first insulating layer 235 is formed on the word line region 220 and subsequently etched using a dry etching process to expose the word line region 220 corresponding to each cell. As a result of the etching process, a plurality of holes H in the first insulating layer are formed.

Figure 3B:
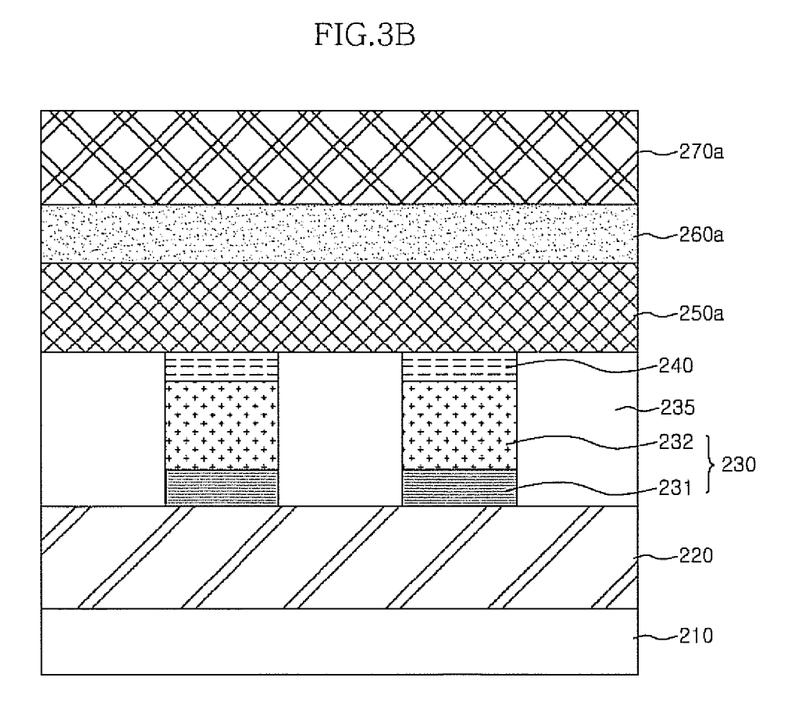

As shown in FIG. 3B, a barrier metal layer 231 is deposited in each of the plurality of holes H, and a P+ polysilicon layer 232 is deposited on the barrier metal layer 231. As a result, a shottky diode 230 is formed within each hole H.

A transition metal layer (not shown) is deposited on a resultant structure of the semiconductor substrate 210 including the shottky diode 230, and subsequently a selective thermal treatment is performed on the transition metal layer to form an ohmic contact layer 240 formed of metal silicide.

As shown in FIG. 3B, a heater material 250a is stacked on the ohmic contact layer 240 and the first insulating layer 235, and a phase-change material 260a is stacked on the heater material 250a. An upper electrode material 270a is stacked on the phase-change material 260a. Here, the heater material 250a may include at least one selected from the group consisting of metal, an alloy, metal oxynitride, an oxide electrode, and a conductive carbon compound. For example, the heater material 250a may includes at least one selected from the group consisting of tungsten (W), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN) tantalum silicon nitride (TaSiN), tantalum aluminum nitride (TaAlN), titanium (Ti) molybdenum (Mo), tantalum (Ta), platinum (Pt), titanium silicide (TiS), tantalum silicide (TaSi), titanium tungsten (TiW), titanium oxynitride (TiON), titanium aluminum oxynitride (TiAlON), tungsten oxynitride (WON), tantalum oxynitride (TaON), and iridium oxide (IrO2). Further, the phase-change material 260a may include at least one selected from the group consisting of tellurium (Te), selenium (Se), germanium (Ge), antimony (Sb), bismuth (Bi), lead (Pb), stannum (Sn), arsenic (As), sulfur (S), silicon (Si), phosphorus (P), oxygen (O), nitrogen (N), a mixture thereof, and an alloy thereof.

Figure 3C:
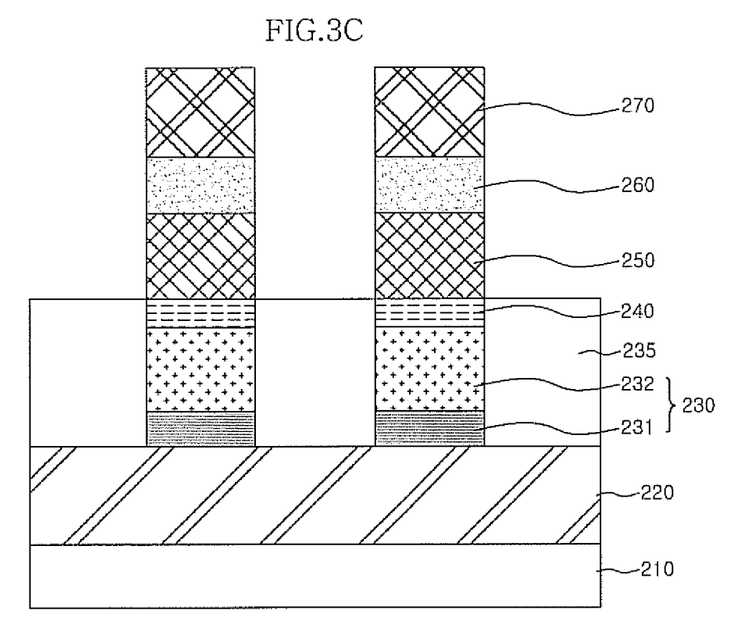

As shown in FIG. 3C, the stacked heater material 250a, phase-change material 260a, and the upper electrode material 270a are etched to form a lower electrode 250, a phase-change layer 260, and an upper electrode 270 to expose the ohmic contact layer 240. The lower electrode 250, the phase-change layer 260, and the upper electrode 270 have a pillar shape after the etching process.

Figure 3D:
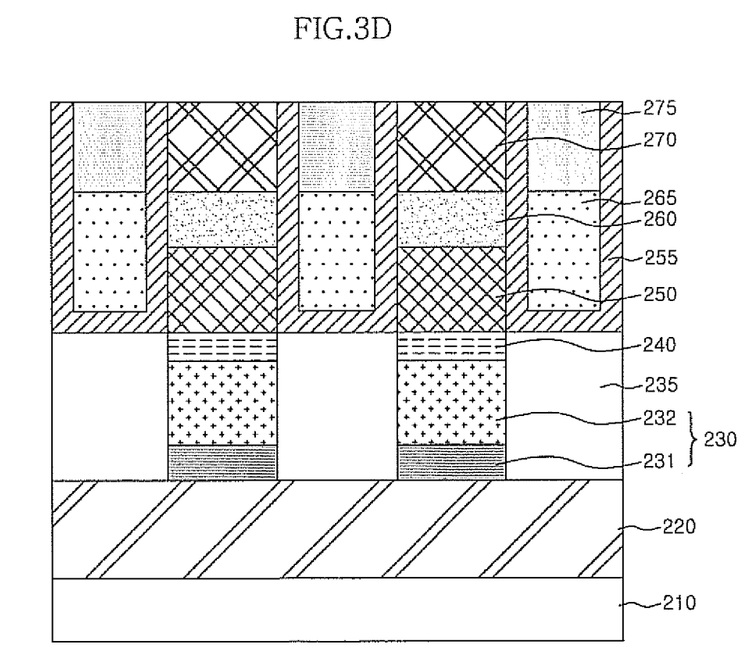

As shown in FIG. 3D a second insulating layer 255 is conformally formed on an upper surface of a resultant structure of the semiconductor substrate including pillar structure including the lower electrode 250, the phase-change layer 260, and the upper electrode 270. A heat absorption material is deposited on the second insulating layer 255 and recessed to form a heat absorption layer 265. At this time, the heat absorption layer 265 is formed in a position adjacent to the lower electrode 250 and the phase-change layer 260 to absorb Joule heat generated at an interface between the lower electrode 250 and phase-change layer 260. The heat absorption material for heat absorption layer 265 may include at least one selected from the group consisting of metal, an alloy, metal oxynitride, an oxide electrode, and a conductive carbon compound. For example, the heat absorption layer may include at least one selected from the group consisting of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, Pt, TiSi, TaSi, TiW, TiON, TiAlON, WON, TaON, and IrO2. The second insulating layer 255 is formed to protect the phase-change layer 260 and electrically insulate the heat absorption layer 265 from the lower electrode 250, the phase-change layer 260, and the upper electrode 270.

A third insulating layer 275 is formed on the heat absorption layer 265 to be buried a recessed area.

Figure 3E:
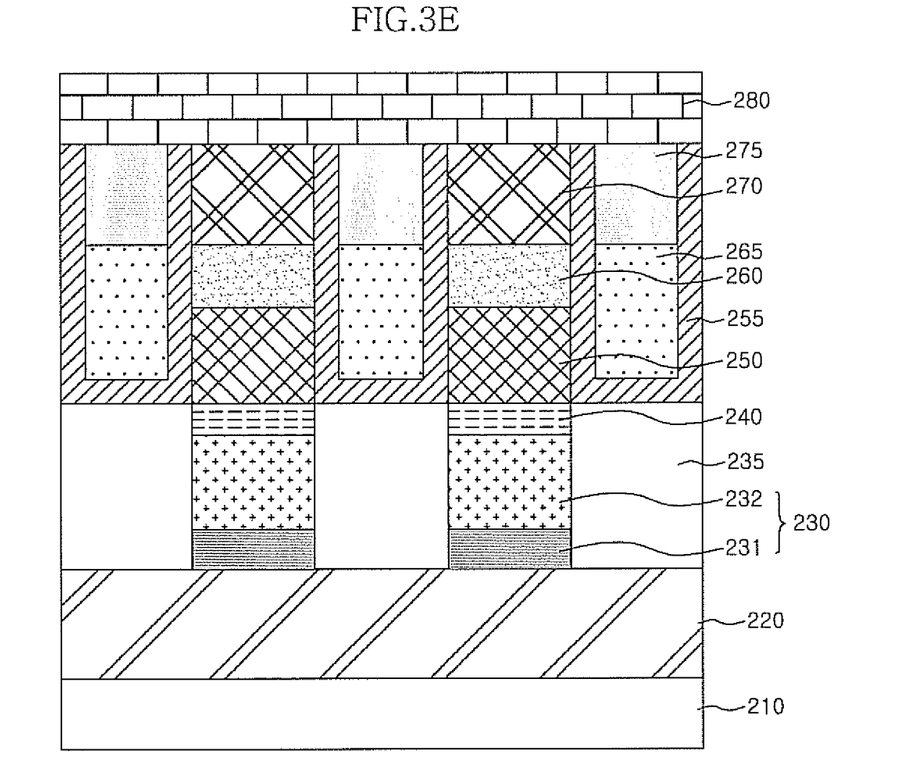

As shown in FIG. 3E, a bit line region 280 is formed and connected to the upper electrode 270.

Hereinafter, a second exemplary embodiment for effectively obtaining an object of the inventive concept will be described.

Figure 4:
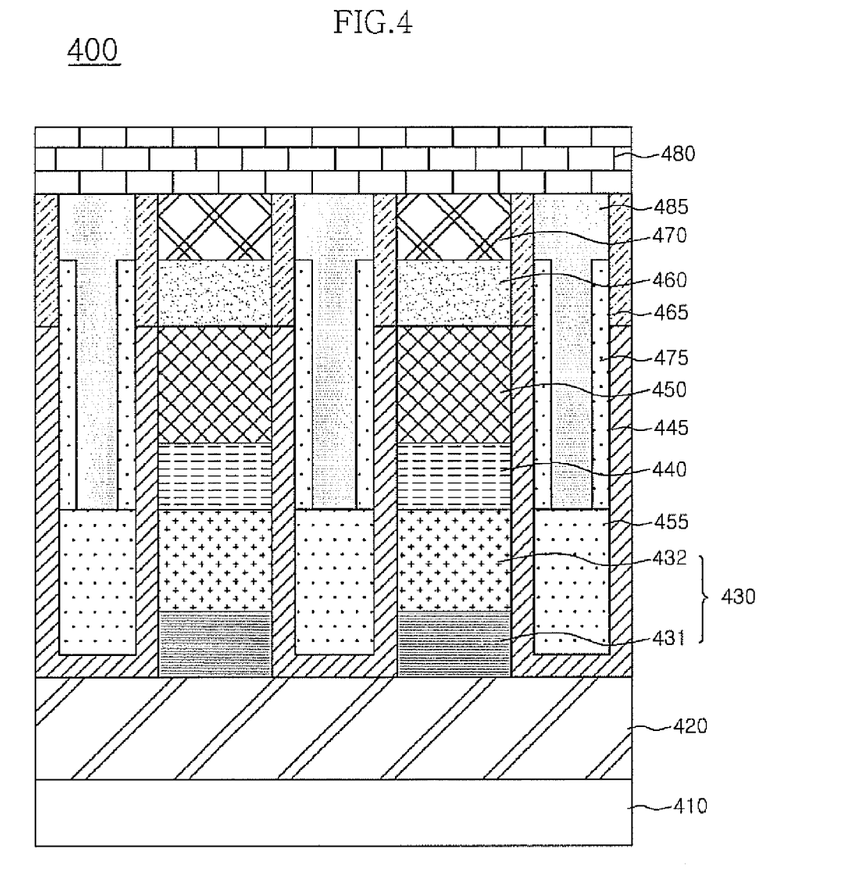
FIG. 4 is a view illustrating a configuration of a PCRAM device according to a second exemplary embodiment of the present invention.

FIG. 4 is a view illustrating a configuration of a PCRAM device according to a second exemplary embodiment.

Referring to FIG. 4, in a PCRAM device 400 according to a second exemplary embodiment, a word line region 420 is formed on a semiconductor substrate 410. The word line region 420 includes a metal layer or a metal nitride layer.

A shottky diode 430 is formed on the word fine region 420 corresponding to each cell. The shottky diode 430 includes a barrier metal layer 431 and a P+ polysilicon layer 432. An ohmic contact layer 440, which may be formed of a metal silicide material, is formed on the shottky diode 430. A plurality of phase-change structures are formed on the ohmic contact layers 440. Each of the plurality of phase-change material structures includes a lower electrode 450, a phase-change layer 460, and an upper electrode 470. Here, the ohmic contact layer 440 is formed to reinforce contact between the shottky diode 430 and the lower electrode 450 and may be omitted.

A first insulating layer 445 is deposited on the word line region 420 to correspond to the shottky diode 430 and the lower electrode 450. A first heat absorption layer 455 is formed between the shottky diodes 430. In the second exemplary embodiment, the switching element is formed as a shottky diode but the switching element is not limited thereto. A PN diode or a MOS transistor may be used as the switching element.

A phase-change layer 460 and an upper electrode 470 are sequentially formed on the lower electrode 450. A second insulating layer 465 is formed on the first insulating layer 445 to correspond to the phase-change layer 460 and the upper electrode 470. At this time, the second insulating layer 465 functions to protect the phase-change layer 460 in a subsequent etching of a spacer insulating layer. A second heat absorption layer 475 is formed on sidewalls of the lower electrode 450 and the phase-change layer 460 to absorb Joule heat generated at an interface between the lower electrode 450 and the phase-change layer 460. The second heat absorption layer 475 is formed to have a spacer shape and extends from an upper surface of the first heat absorption layer 455. The PCRAM device 400 according to the second exemplary embodiment includes the first heat absorption layer 455 and the second heat absorption layer 475 formed in a position corresponding to the shottky diode and a position corresponding to the lower electrode 450 and the phase-change layer 460 to improve absorption of Joule heat generated at the interface between the lower electrode 450 and the phase-change layer 460 as compared with the PCRAM 200 according to the first embodiment. A fourth insulating layer is formed above the first heat absorption layer 455 and between sidewalls of the second heat absorption layer 475 and above an upper surface of the second heat absorption layer 475.

A bit line region 480 is formed on the upper electrode 470.

A method of manufacturing the PCRAM according to the second exemplary embodiment will be described in detail with reference to FIGS. 5A to 5J.

FIGS. 5A to 5E are views sequentially illustrating a method of manufacturing the PCRAM according to the second exemplary embodiment.

Figure 5A:
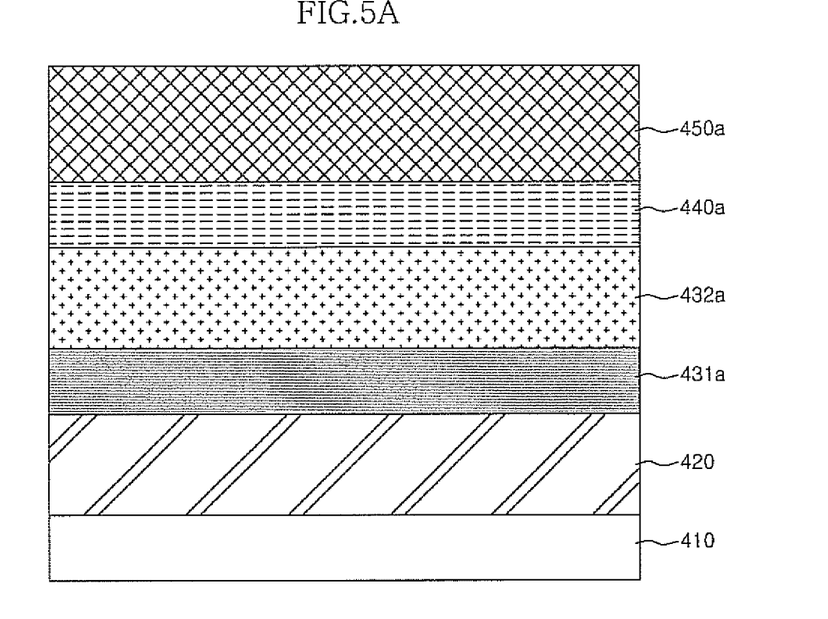
FIGS. 5A to 5J are views sequentially illustrating a method of manufacturing a PCRAM device according to the second exemplary embodiment of the present invention.

First, as shown in FIG. 5A, a semiconductor substrate 410 is provided. A word line region 420 that includes a metal layer or a metal nitride layer is formed on the semiconductor substrate 410.

A metal material 431a is deposited on the word line region 420, and a silicon material 432a is deposited on the deposited on the metal material 431a.

A metal silicide material 440a is deposited on the deposited silicon material 432a, and a heater material 450a is deposited on the deposited silicide material 440a. Here, the heater material 450a may include at least one selected from the group consisting of metal, an alloy, metal oxynitride, an oxide electrode, and a conductive carbon compound. For example, the heat material 450a may include at least one selected from the group consisting of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, Pt, TiSi, TaSi, TiW, TiON, TiAlON, WON, TaON, and IrO2.

Figure 5B:
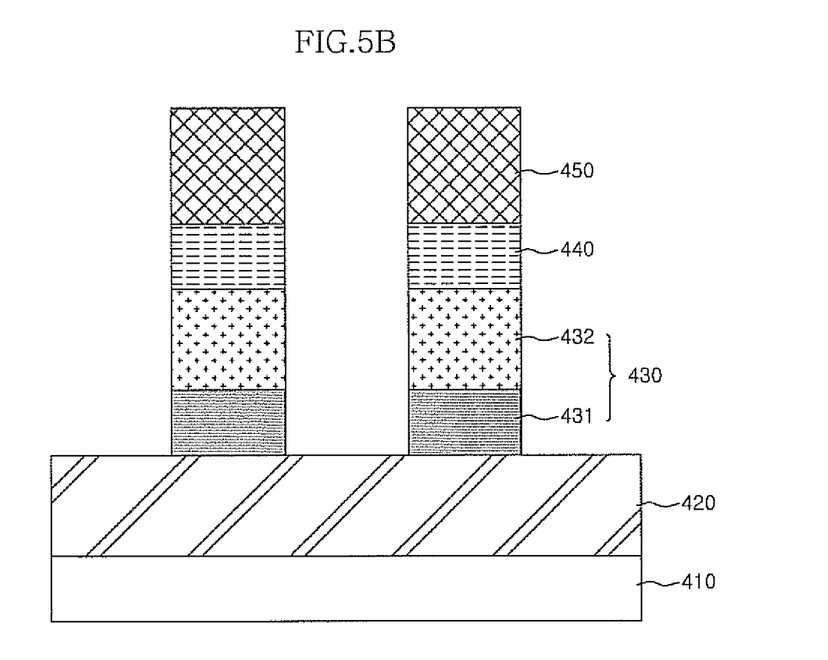

As shown in FIG. 5B, the deposited metal material 431a, silicon material 432a, silicide material 440a, and heater material 450a are etched in a pillar shape to expose the word line region 420. As a result, a shottky diode 430 including a barrier metal layer 431 and a P+ polysilicon layer 432, an ohmic contact layer 440, and a lower electrode 450 are formed.

Figure 5C:
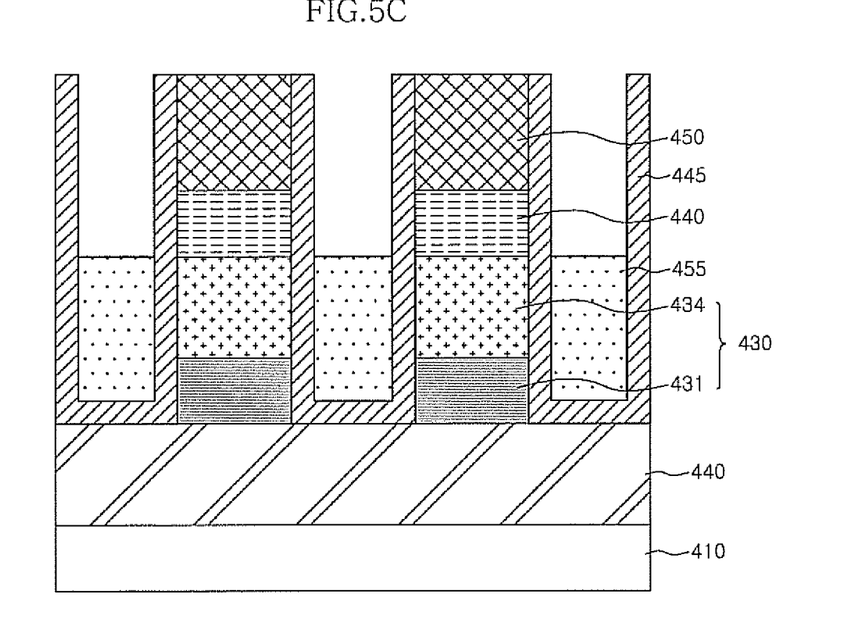

As shown in FIG. 5C, a first insulating layer 445 is conformally formed on an upper surface of the word line region 200 and sidewalls of the shottky diode 430, the ohmic contact layer 440, and the lower electrode 450. A first heat absorption layer 455 is deposited between the first insulating layer 445 and etched back so that the first heat absorption layer 455 is recessed. At this time, the first insulating layer 445 functions to insulate the first heat absorption layer 455 from the shottky diode 430. A heat absorption material for the first heat absorption layer 455 may include at least one selected from the group consisting of metal, an alloy, metal oxynitride, an oxide electrode, and a conductive carbon compound. For example, the heat absorption material for the first heat absorption layer 455 may include at least one selected from the group consisting of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, Pt, TiSi, TaSi, TiW, TiON, TiAlON, WON, TaON, and IrO2.

Figure 5D:
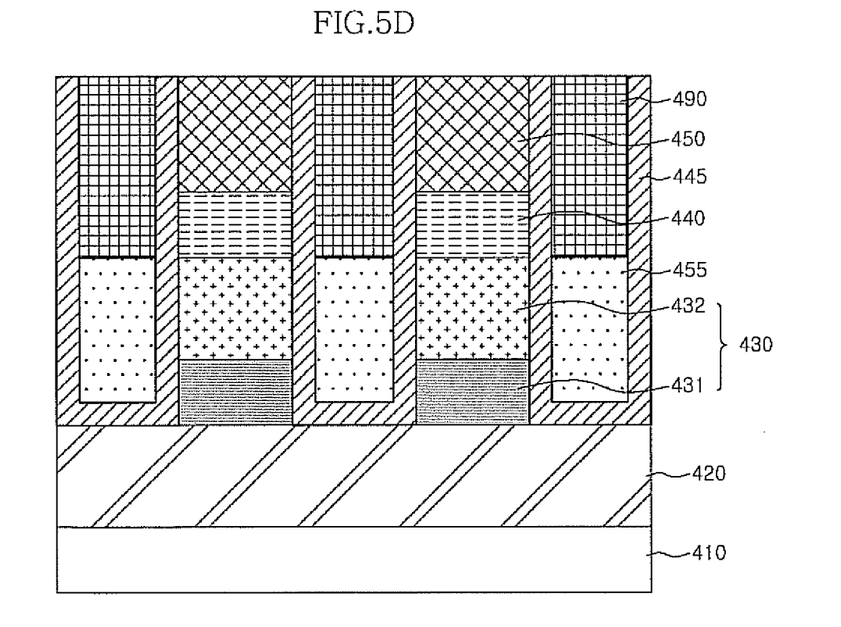

As shown in FIG. 5D, a second insulating layer 490 is formed on the first heat absorption layer 455, more specifically, in an area where the first heat absorption layer 455 is recessed. The second insulating layer 490 may be a sacrificial insulating layer.

Figure 5E:
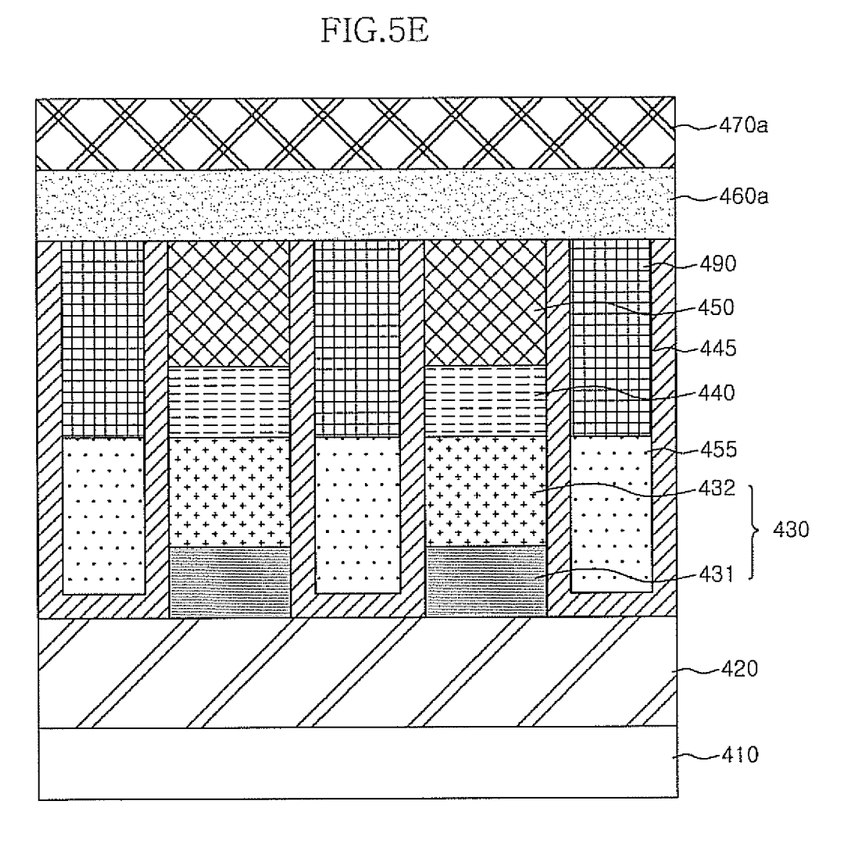

As shown in FIG. 5E, a phase-change material 460a is deposited on the first insulating layer 445, the second insulating layer 490, and the lower electrode 450 and subsequently, an upper electrode material 470 is deposited on the phase-change material 460a. Here, the phase-change material 460a may include at least one selected from the group consisting of tellurium (Te), selenium (Se), germanium (Ge), antimony (Sb), bismuth (Bi), lead (Pb), stannum (Sn), arsenic (As), sulfur (S), silicon (Si) phosphorus (P), oxygen (O), nitrogen (N), a mixture thereof, and an alloy thereof.

Figure 5F:
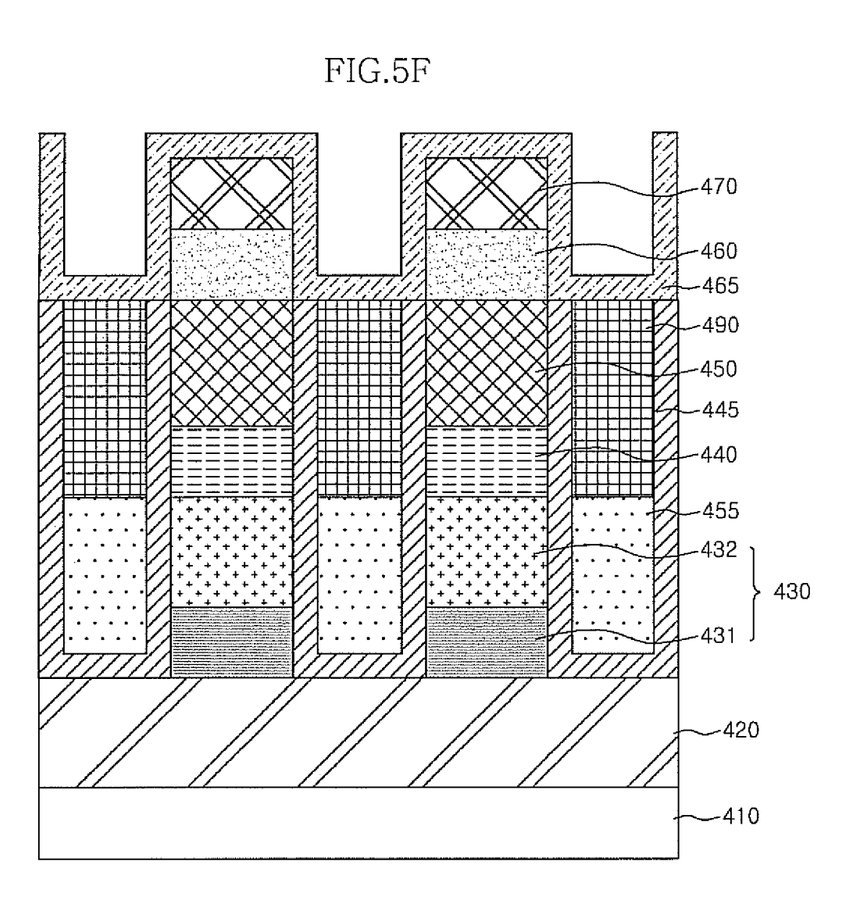

As shown in FIG. 5F, the phase-change material 460a and the upper electrode material 470 are etched in a pillar shape to expose the second insulating layer 490. As a result, the phase-change layer 460 and the upper electrode 470 are formed. A third insulating layer 465 is formed above the second insulating layer 490 and may include a spacer insulating layer.

Figure 5G:
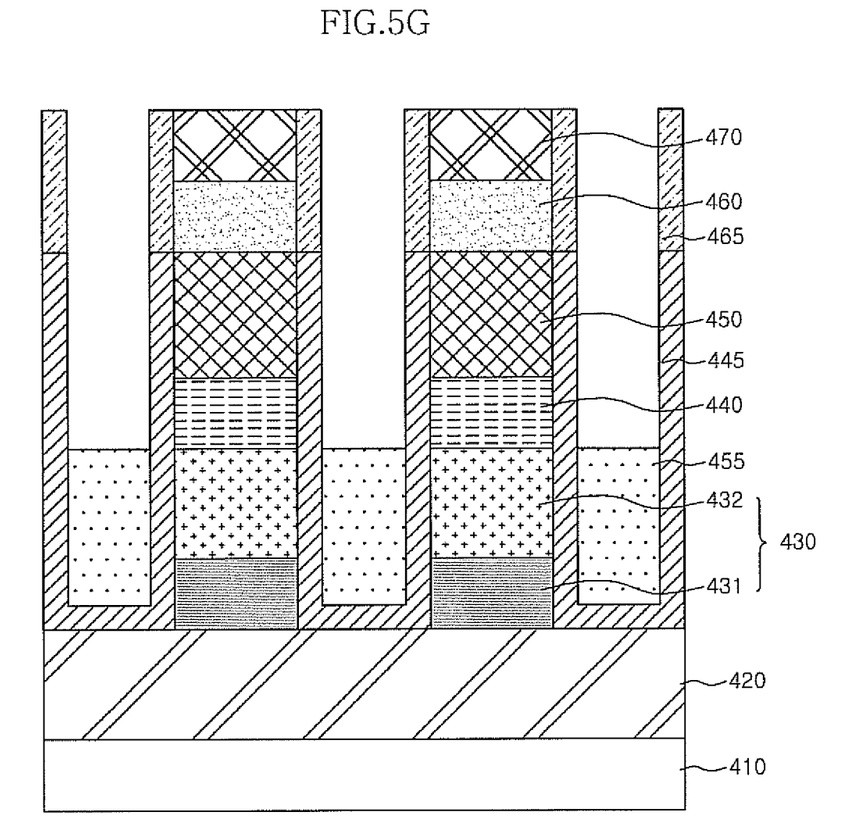

As shown in FIG. 5G, the third insulating layer 465 is etched by a spacer etching method. At this time, when the third insulating layer 465 is etched, the second insulating layer 490 is also etched so that the second insulating layer 490 is removed to expose the first heat absorption layer 455. Further, the third insulating layer 465 functions to protect the phase-change layer 460 during the spacer etching process.

Figure 5H:
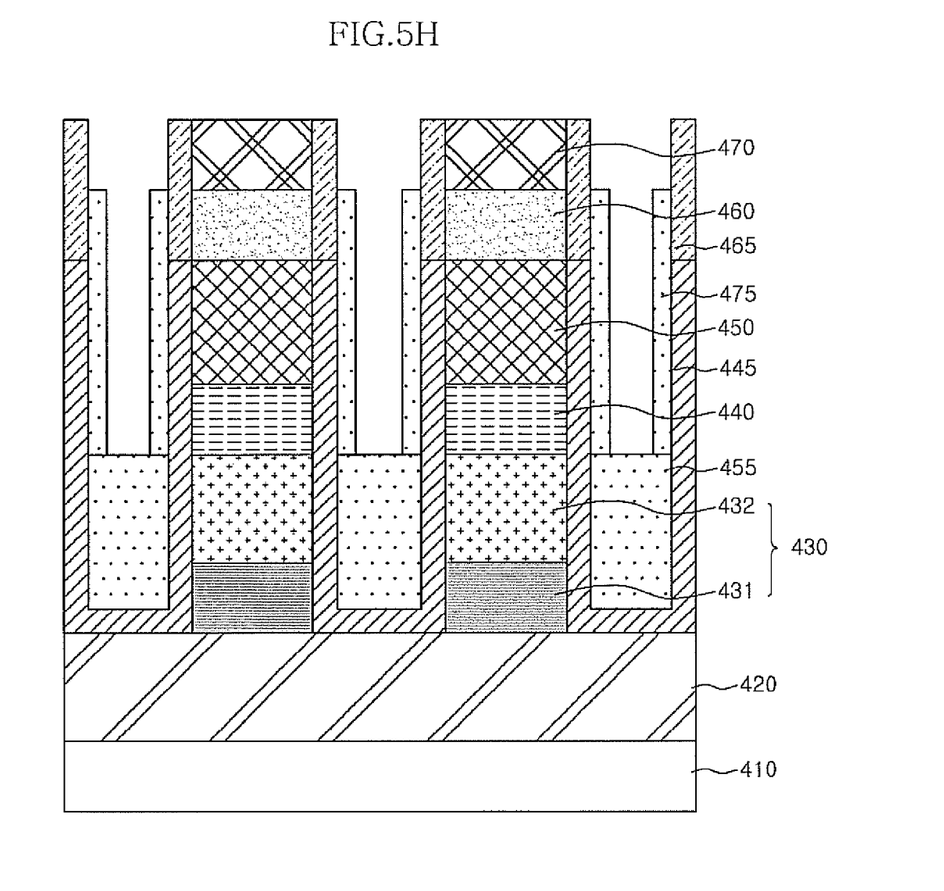

As shown in FIG. 5H, a second heat absorption material for a second heat absorption layer 475 is deposited above the first heat absorption layer 455 on the sidewalls of the first insulating layer 445, and the second heat absorption layer 475 is subsequently etched by a spacer etching method to form the second heat absorption layer 475. The second heat absorption layer 475 is formed on sidewalls of the first and third insulating layers 445 and 465 at a height corresponding to the ohmic contact layer 440, the lower electrode 450, and the phase-change layer 460. Also, the second heat absorption layer 475 is connected to the first heat absorption layer 455. In this embodiment, the second heat absorption material for the second heat absorption layer 475 may include at least one selected from the group consisting of metal, an alloy, metal oxynitride, an oxide electrode, and a conductive carbon compound. For example, the second heat absorption material for the second heat absorption layer 475 may include at least one selected from the group consisting of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, Pt, TiSi, TaSi, TiW, TiON, TiAlON, WON, TaON, and IrO2.

Figure 5I:
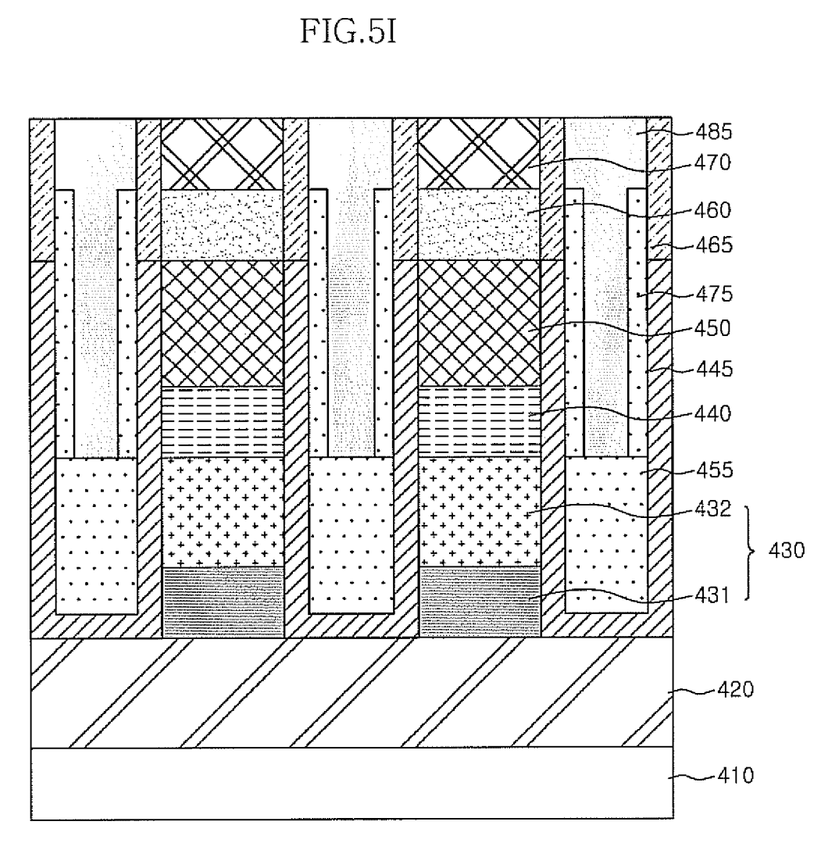

Referring to FIG. 5I, a fourth insulating layer 485 is formed to be buried in a space where the second insulating layer 490 is removed.

Figure 5J:
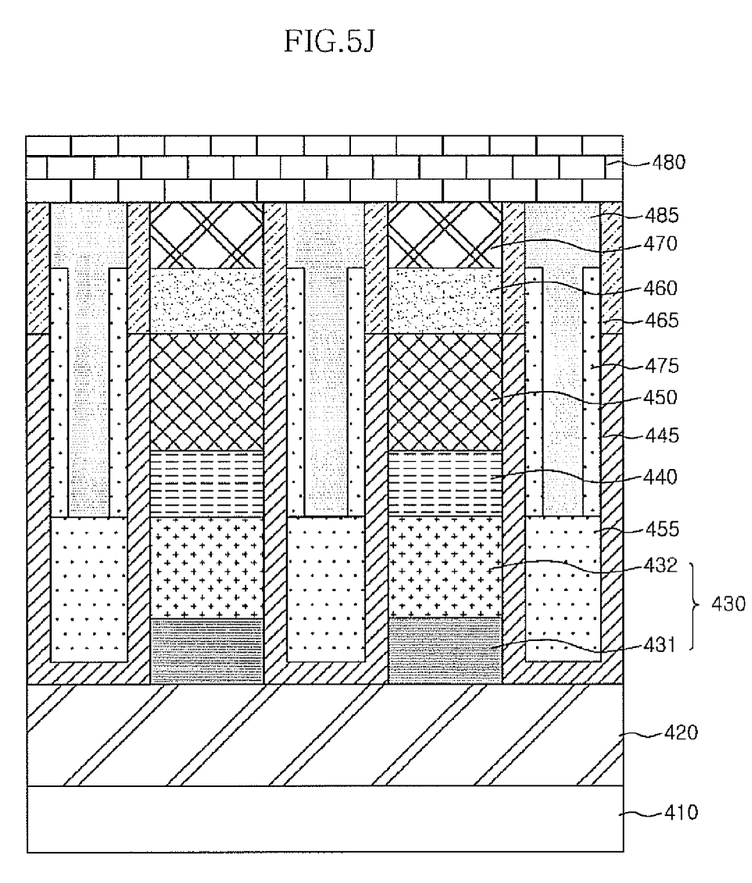

As shown in FIG. 5J, a bit line region 480 is formed and connected to the upper electrode 470.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of manufacturing phase-change random access memory (PCRAM) device, comprising:
    providing a semiconductor substrate;
    foaming switching elements on the semiconductor substrate;
    forming a plurality of phase-change structures on the switching elements; and
    forming heat absorption layers between the plurality of phase-change structures,
    wherein the forming each of the plurality of phase-change structures includes:
        forming a heater material on each of the switching elements;
        forming a phase-change material on the heater material;
        forming an upper electrode material on the phase-change material; and
        etching the heater material, the phase-change material, and the upper electrode material to form a pillar including the lower electrode, the phase-change layer, and the upper electrode.

2. The method of claim 1, wherein, after the etching for forming the lower electrode, the phase-change layer, and the upper electrode, comprising forming an insulation layer on sidewalls of the phase-change structures.

3. The method of claim 2, wherein the forming the heat absorption layer includes:
    forming a heat absorption material for the heat absorption layer between the insulation layer; and
    etching back the heat absorption material so that the heat absorption layer is recessed.

4. The method of claim 3, wherein the heat absorption material includes at least one selected from the group consisting of metal, an alloy, metal oxynitride, oxide, and a conductive carbon compound.

5. A method of manufacturing phase-change random access memory (PCRAM) device, comprising:
    providing a semiconductor substrate;
    forming a switching element and a lower electrode on the semiconductor substrate;
    forming a first insulating layer on sidewalls of the switching element and the lower electrode;
    forming a first heat absorption layer between the first insulating layer to a height corresponding to the switching element;
    forming a phase-change layer and an upper electrode on the switching element;
    forming a second insulating layer on sidewalls of the phase-change layer and the upper electrode; and
    forming a second heat absorption layer connected to the first heat absorption layer to a height corresponding to the lower electrode and the phase-change layer.

6. The method of claim 5, wherein the forming a switching element and the lower electrode includes:
    forming a switching element material;
    forming a heater material on the switching element material; and
    etching the switching element material and the heater material to form the switching element and the lower electrode in a pillar shape.

7. The method of claim 6, wherein the forming the first heat absorption layer includes:
    etching the first insulating layer so that the first insulating layer is formed on sidewalls of the switching element and the lower electrode and on an upper surface of the semiconductor substrate;
    forming a first heat absorption layer above and between the first insulating layer;
    etching back the first heat absorption layer so that the heat absorption layer is recessed; and
    forming a sacrificial insulating layer on the first heat absorption layer adjacent to the lower electrode.

8. The method of claim 7, wherein the first heat absorption material includes at least one selected from the group consisting of metal, an alloy, metal oxynitride, oxide, and a conductive carbon compound.

9. The method of claim 8, wherein the forming the phase-change layer and the upper electrode includes:
    forming a phase-change material on the lower electrode and the sacrificial insulating layer;
    forming an upper electrode material on the phase-change material; and etching the phase-change material and the upper electrode material to form the phase-change layer and the upper electrode in a pillar shape to expose the sacrificial insulating layer.

10. The method of claim 9, wherein the forming the second heat absorption layer includes:
    etching the second insulating layer and the sacrificial layer so that the second insulating layer is formed on sidewalls of the phase-change layer and the upper electrode and to expose the first heat absorption layer;
    forming a second heat absorption material on the first heat absorption layer to connect the first heat absorption layer and the second heat absorption layer; and
    etching back the second heat absorption material so that the second heat absorption layer is recessed and formed on sidewalls of the first and second insulating layer to a height corresponding to the upper surface of the phase-change layer.

11. The method of claim 10, wherein each of the first heat absorption layer and the second heat absorption layer includes at least one selected from the group consisting of metal, an alloy, metal oxynitride, oxide, and a conductive carbon compound.

* * * * *